US005847331A

United States Patent [19]

Vollmer et al.

[11] Patent Number: 5,847,331

[45] Date of Patent: Dec. 8, 1998

[54] OMNIDIRECTIONAL LOUDSPEAKER

[76] Inventors: Edward Vollmer; Teresa Hart, both of 1925 46th Ave., No. 41, Capitola, Calif. 95010

[21] Appl. No.: 948,243

[22] Filed: Oct. 9, 1997

[51] Int. Cl.[6] .......... H05K 5/00

[52] U.S. Cl. .......... 181/147; 181/151; 181/152; 181/156; 181/199

[58] Field of Search .......... 181/144, 145, 181/146, 147, 151, 152, 154, 155, 156, 160, 199

[56] References Cited

U.S. PATENT DOCUMENTS

| | | | |
|---|---|---|---|
| 3,483,945 | 12/1969 | Michael . | |
| 3,816,672 | 6/1974 | Gefvert et al. | 181/144 |
| 3,961,684 | 6/1976 | Michael et al. . | |
| 4,336,861 | 6/1982 | Peter | 181/144 |
| 4,420,061 | 12/1983 | Levy | 181/144 |
| 4,440,259 | 4/1984 | Strohbeen | 181/146 |
| 5,086,871 | 2/1992 | Barbe . | |
| 5,115,882 | 5/1992 | Woody . | |
| 5,227,591 | 7/1993 | Tarkkonen | 181/145 |
| 5,436,976 | 7/1995 | Dougherty . | |
| 5,451,726 | 9/1995 | Haugum . | |

*Primary Examiner*—Khanh Dang
*Attorney, Agent, or Firm*—Terrance L. Siemens

[57] ABSTRACT

A speaker propagating sound waves in the manner of a point source. The speaker includes high, medium, and low range drivers vertically arranged within a vertically arranged tubular support member having sound escape openings in its lateral wall. The high and medium range drivers project sound upwardly, and the low range driver projects sound downwardly. The speaker has a truncated obeliskoid housing including a chamber disposed below the low range speaker. This chamber is muffled to absorb non-coherent sound, and has a vertical air tube for managing air flow within the chamber and conducting sound waves downwardly from the housing. The high range driver is exposed above the housing, so that sound projects upwardly therefrom. Sound produced by the medium range driver passes through the openings in the tubular support member. The housing is supported on casters for mobility.

10 Claims, 3 Drawing Sheets

OMNIDIRECTIONAL LOUDSPEAKER

BACKGROUND OF THE INVENTION

1. Field of the Invention

The present invention relates to loudspeakers for propagating reproduced or transmitted sound. More particularly, the invention relates to a loudspeaker providing a point source effect together with accurate reproduction of relative low, medium, and high frequency sound. The novel speaker is particularly suited for use in an enclosed space having a ceiling, floor, and walls, the speaker being configured to exploit sound reflection from these surfaces to advantage. The novel speaker is usable in residential and commercial settings in buildings.

2. Description of the Prior Art

In the field of speakers and sound projection, it has long been the goal to combine point source, uniformly omnidirectional propagation of sound with the use of plural speakers, each dedicated to a relative band of frequency reproduction. However, every proposed design entails compromises in performance, as no previous design has actually successfully combined point source propagation with plural speakers. It has been recognized that radially symmetrical reflectors assist in propagating sound about three hundred sixty degrees from an axis perpendicular to the diaphragm of each driver. Attempts to incorporate such reflectors into an assembly supporting plural speakers have not succeeded in producing a radially symmetrical, strong stereo effect capable of transmitting accurately reproduced sound throughout a volume of a listening environment that accommodates more than a handful of people.

The prior art has proposed speaker assemblies having multiple drivers arranged in various ways with respect to sound reflecting surfaces to achieve the desired combination. For example, U.S. Pat. No. 5,086,871, issued to Alain Barbe on Feb. 11, 1992, describes a speaker system comprising a parallelepiped enclosing a low range speaker and a high range speaker disposed vertically and facing one another. Each speaker is separated from the other by walls inclined to reflect sound horizontally. A small deflector is disposed between the two individual speakers. Barbe lacks the truncated obeliskoid housing, vertical interior air conduit, and the windowed, covered speaker support member of the present invention.

U.S. Pat. No. 3,961,684, issued to Stanley H. Michael et al. on Jun. 8, 1976, describes a speaker assembly arranged to have a plurality of vertically stacked individual speakers. The uppermost and lowermost speakers are stationary. The intermediate speakers are rotatably mounted. Michael et al. lacks the truncated obeliskoid housing, vertical interior air conduit, and the windowed, covered speaker support member of the present invention.

U.S. Pat. No. 5,451,726, issued to Ted L. Haugum on Sep. 19, 1995, shows a construction for a housing enclosing coaxially disposed high and low range speakers. The housing has an upper parabolic reflecting surface cooperating with a generally conical lower reflective surface. Haugum lacks the truncated obeliskoid housing, vertical interior air conduit, and the windowed, covered speaker support member of the present invention.

U.S. Pat. No. 5,115,882, issued to D. Grier Woody on May 26, 1992, illustrates a speaker system wherein high and low range drivers are mounted coaxially and vertically, each projecting acoustical energy towards one of two cones. The cones redirect acoustical energy horizontally. The speakers are fully exposed to the exterior of the device, there being no housing per se. Woody lacks the truncated obeliskoid housing, vertical interior air conduit, and the windowed, covered speaker support member of the present invention.

None of the above inventions and patents, taken either singly or in combination, is seen to describe the instant invention as claimed.

SUMMARY OF THE INVENTION

The present invention provides a speaker producing time and phase coherent sound waves propagated radially symmetrically, in a manner similar to that of a point source. The enclosure is tuned and ported, generates no back pressure, and has a truncated obeliskoid configuration. The apparatus includes a high frequency range driver, a midrange driver, and a low frequency range driver, all vertically and coaxially arranged. The three drivers are interconnected by a high fidelity, three way electronic crossover network which distributes appropriate frequency range signals to each driver.

The high range and midrange drivers project sound upwardly, while the low range driver projects sound downwardly. This arrangement results in a speaker particularly suitable for operating in an enclosed room. The novel configuration assures that sound waves will reflect from the ceiling and floor of a room in which the speaker is located, and will converge on each listener in a manner essentially duplicating symmetrical propagation from a point source.

The housing is configured to preserve integrity of low frequency sound, having a chamber dedicated to receiving low frequency sound, the chamber being particularly suited to such sound. Sound absorbent material absorbs non-coherent reflections within the housing. A tubular conduit controls air migration within the housing, thereby contributing to preservation of low frequency sound. The housing thus passes undistorted, coherent sound to the listening environment.

The novel speaker is readily and economically fabricated from readily available, conventional materials and components.

Accordingly, it is a principal object of the invention to provide a speaker which propagates phase and time coherent sound waves in the manner of a point source.

It is another object of the invention to project sound waves from a high range driver, a midrange driver, and a low range driver.

It is still another object of the invention to project higher frequency sound waves in one direction and lower frequency sound waves in an opposite direction.

It is a further object of the invention to absorb non-coherent reflections within the housing of the speaker.

It is again an object of the invention to provide a chamber preserving the integrity of low frequency sound.

Still another object of the invention is to control air migration within the low frequency sound chamber.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Various other objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENTS

Figure 1:
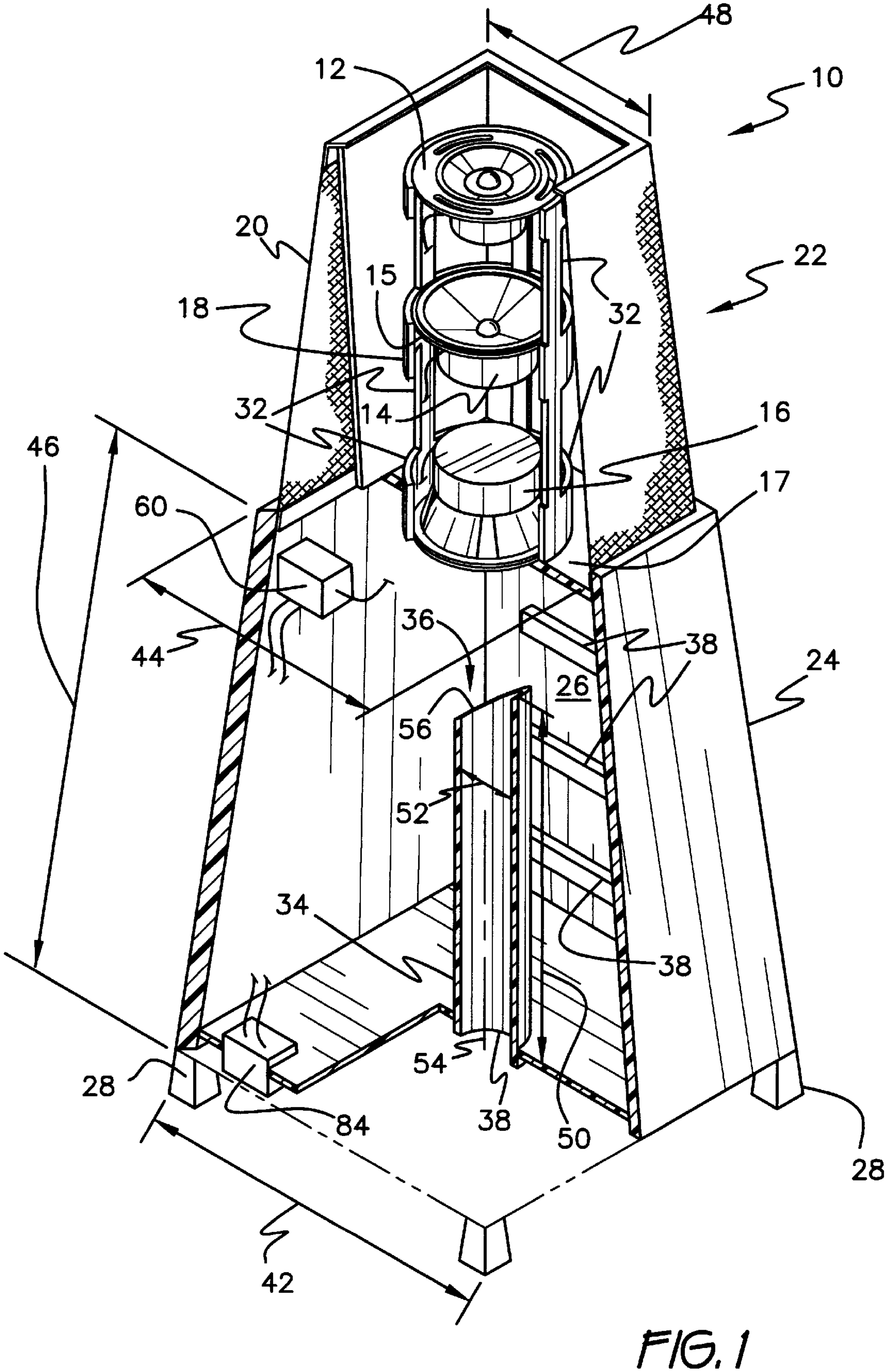
FIG. 1 is a side elevational view of the invention, rendered mostly in cross section.

Turning now to FIG. 1 of the drawings, speaker 10 propagates phase and time coherent sound waves in the manner of a point source by incorporating the following construction. Speaker 10 has a relatively high frequency range driver 12, a relatively low frequency range driver 16, and an intermediate frequency range driver 14, all mounted and supported within a driver support member 18 coaxially in vertical orientation. High range driver 12 and intermediate range driver 14 are disposed upon driver support member 18 to project sound waves in one direction, that is, upwardly, and low frequency driver 16 is disposed upon driver support member 18 to project sound waves in an opposite direction, or downwardly.

Driver support member 18 is mounted within an upper section 20 of a housing 22. Housing 22 includes a lower section 24 enclosing a low frequency sound propagation chamber 26 disposed below low range driver 16. By virtue of upper section 20 being disposed above low frequency sound propagation chamber 26, housing 22 assumes a truncated obeliskoid configuration. Caster wheels 28 are fixed to and depend from housing 22, whereby speaker 10 may be maneuvered by being wheeled on a floor surface (not shown).

Figure 2:
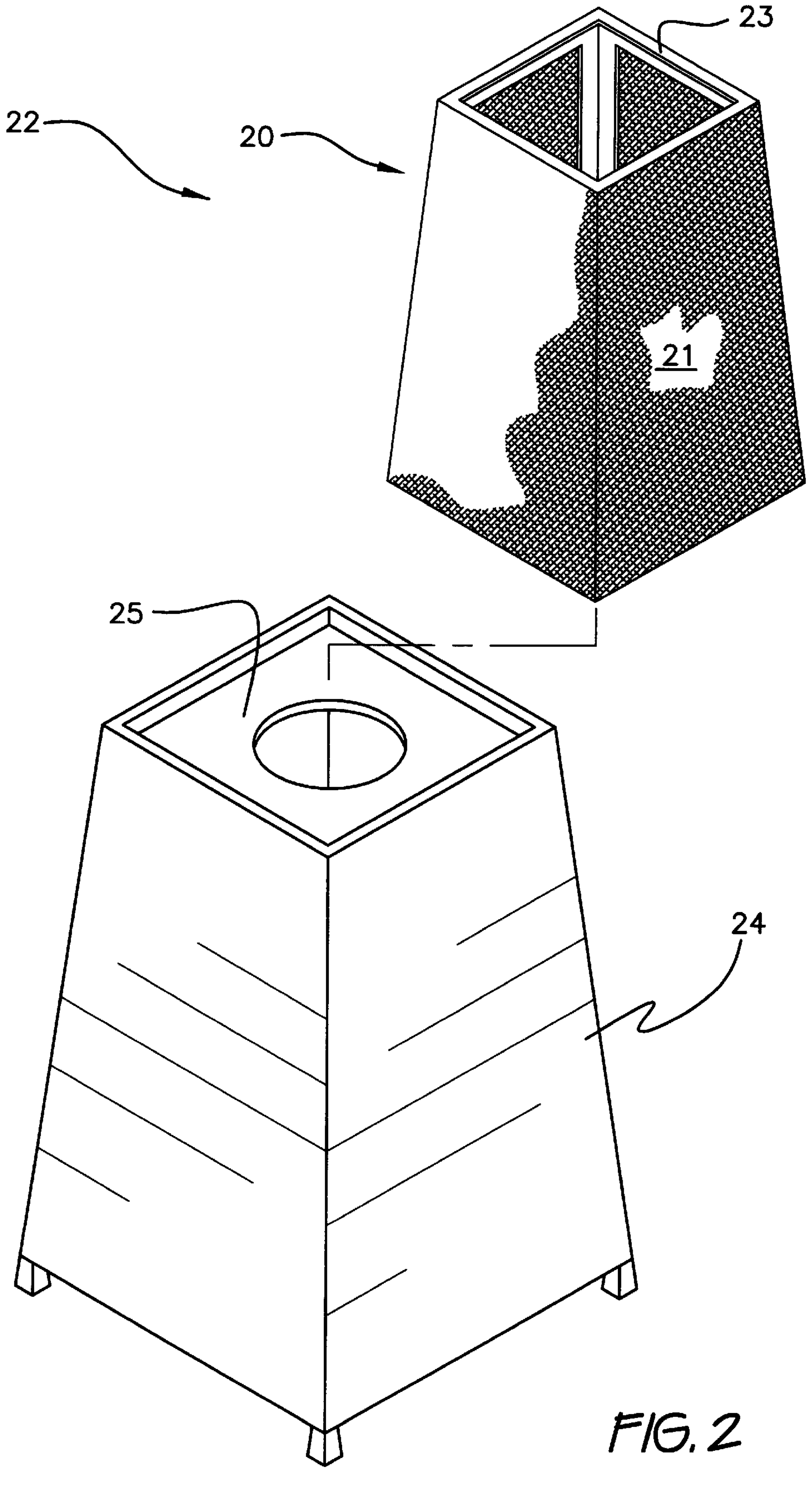
FIG. 2 is an exploded, perspective view of the exterior housing of the invention.

Truncated obeliskoid configuration is clearly seen in FIG. 2, wherein upper section 20 is seen to comprise an acoustically transmissive material 21, such as a polyester knit fabric, supported on a structural frame 23 having openings to allow sound to pass through material 21 to the exterior of housing 22. Also seen in this view are a support plate 25 to which driver support member 18 (see FIG. 1) may be fixed. Upper section 20 of housing 22 may have a covering (not shown) of acoustically transmissive material located at the top thereof, if desired, to protect the diaphragm of driver 12.

Figure 3:
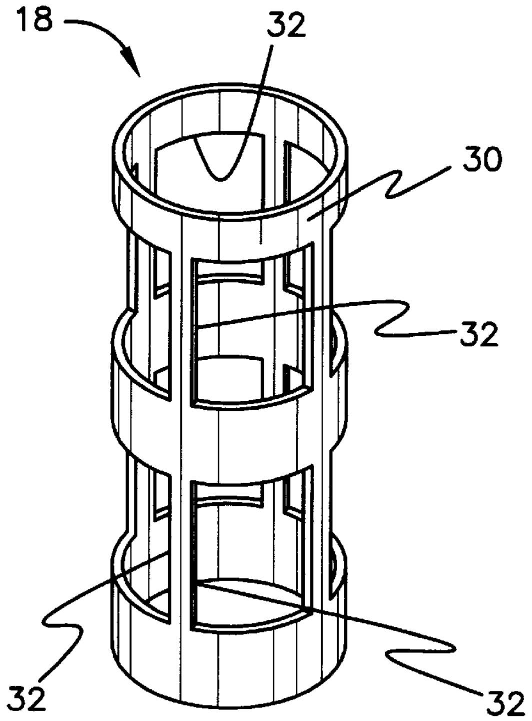
FIG. 3 is a perspective detail view of a member supporting the three drivers employed in the novel speaker.

Driver support member 18 is more clearly shown in FIG. 3. Member 18 is formed from a material such as a synthetic resin similar to acrylonitrile butadiene styrene (ABS) or polyvinyl chloride (PVC), so that member 18 has only sound reflective exposed surfaces. Member 18 is generally tubular, having a partially tubular lateral wall 30 including openings 32 formed in wall 30 such that sound generated by driver 14 can escape from member 18, and pass through upper section 20 of housing 22. After assembly of drivers 12, 14, 16 within member 18, the exterior surface of wall 30 is preferably lined with acoustically transmissive padding (not shown), such as the material employed for covering housing 22.

Referring again to FIG. 1, the diaphragm or diaphragm support component (neither separately shown) of each driver 12, 14, or 16 is mounted to an associated plate 13, 15, or 17 fixed to member 18. Plates 13, 15, 17 are similar to plate 25 of housing lower section 24 in that they cooperate with driver support member 18 and have openings for passing sound vertically from their respective diaphragms.

Low frequency sound propagation chamber 26 has an air conduit 34 projecting thereinto. Air conduit 34 has a proximal end 36 opening towards low frequency range driver 16 and a distal end 38 opening to and below the exterior of housing 22. Air conduit 34 extends into low frequency sound propagation chamber 26 more than half of the height of chamber 26, whereby air conduit 34 enables air to migrate within chamber 26 while limiting disruption of air occupying chamber 26. Air conduit 34 is centrally located within chamber 26, vertically oriented, and, being constructed in a manner generally similar to that of member 18, has only sound reflective exposed surfaces.

Low frequency sound escapes from chamber 26 through horizontally oriented, vertically spaced apart slats 38 formed in the interior walls of housing section 24. Slats 38 are disposed to communicate between chamber 26 and the interior of housing 22.

Figure 4:
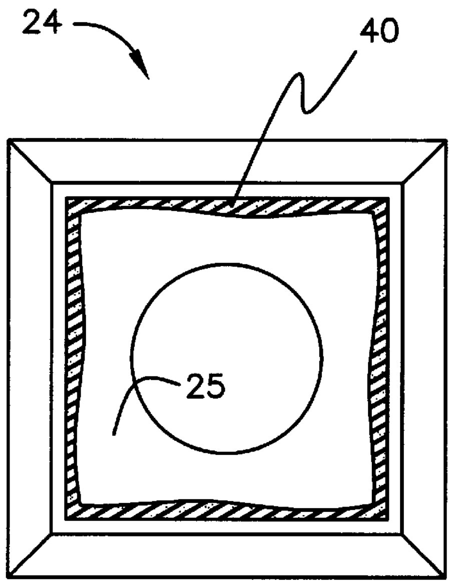
FIG. 4 is a top plan detail view of the exterior housing of the invention.

As seen in FIG. 4, low frequency sound propagation chamber 26 has a sound absorbing interior liner 40 having sound absorbency characteristics equivalent to two inch thick cotton batting (not shown). Liner 40 absorbs noncoherent reflections within chamber 26. Liner 40 may, of course, employ different materials. Closed cell synthetic foam sheet of one quarter inch thickness has proved satisfactory.

In an embodiment dimensioned and configured to be suitable for use in a room (not shown) of a typical residence, lower section 24 of housing 22 has a lowermost width, indicated by arrow 42, in a range of sixteen to twenty inches, and preferably eighteen inches, an uppermost width, indicated by arrow 44, in a range of twelve to sixteen inches, and preferably fourteen inches, and a height, indicated by arrow 46, in a range of twenty-two to twenty-seven inches, the height preferably being twenty-four and one half inches. Driver support member 18 has a diameter, indicated by arrow 48, in a range of eleven to thirteen inches, the diameter preferably being twelve inches. Air conduit 34 has a height, indicated by arrow 50, in a range of thirteen to fifteen inches, the height preferably being fourteen inches. Diameter of air conduit 34, indicated by arrow 52, is preferably four inches. Proximal end 36 of air conduit 34 is preferably arranged as though cut at a forty-five degree angle to axis 54 of conduit 34. This angle is defined between upper edge 56 of conduit 34 and axis 54.

Figure 5:
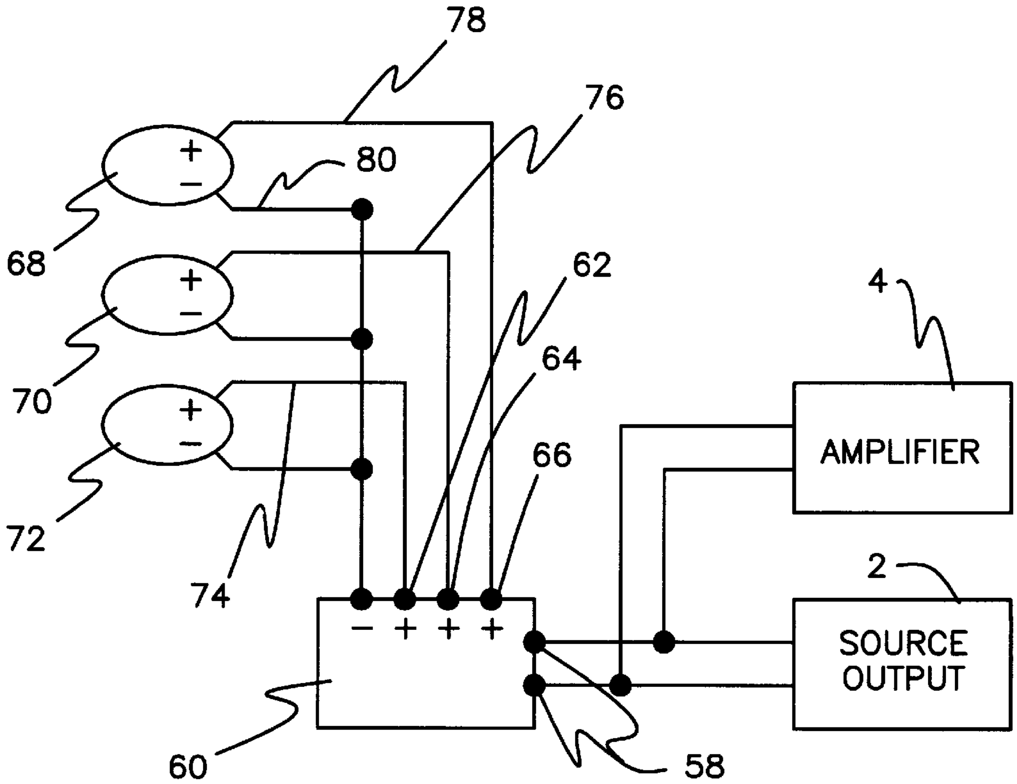
FIG. 5 is an electrical schematic illustrating connection of individual drivers to an external source of sound.

FIG. 5 shows connection of electrical components of speaker 10 to cooperate with conventional external electrical or electronic components generating and modifying sound being projected by speaker 10. A source of sound being projected by speaker 10, the source being shown representatively as source output 2, and a representative external amplifier shown at 4, are connected to input terminals 58 of a high fidelity, three way crossover network 60. Network 60 transmits appropriate frequency signals to drivers 12, 14, 16, thereby reproducing a full spectrum of audible sound with minimal distortion. Network 60 has three positive terminals 62, 64, 66 which enable connection to coils 68, 70, 72 of respective drivers 12, 14, 16 by conductors 74, 76, 78. The negative sides of coils 68, 70, 72 are connected in common to a conductor 80 connected to negative terminal 82 of network 60.

FIG. 1 shows a preferred location of crossover network 60 within housing 22. Also shown in FIG. 1 is a terminal assembly 84 enabling ready connection of conductors 6, 8 (see FIG. 5) extending from the source 2 of sound being projected. Location of terminal assembly 84 assures that access for connection is provided without requiring access to the interior of housing 22. Terminal assembly 84 is located at the outer perimeter of housing 22, thereby obviating necessity of tilting speaker 10 when making electrical connections.

It is to be understood that the present invention is not limited to the embodiments described above, but encompasses any and all embodiments within the scope of the following claims.

We claim:

1. A speaker propagating phase and time coherent sound waves in the manner of a point source, comprising:

a relatively high frequency range driver, a relatively low frequency range driver, and an intermediate frequency range driver;

a driver support member supporting said high frequency range driver, said intermediate frequency range driver, and said low frequency range driver, where said high frequency range driver and said intermediate range driver are disposed upon said driver support member such that both said high frequency and said intermediate frequency range drivers project sound waves in a first direction, and said low frequency driver disposed on said driver support member such that said low frequency range driver projects sound waves in a second direction, said second direction being opposite said first direction; and a housing comprising a low frequency sound propagation chamber, said low frequency sound propagation chamber located below said low frequency range driver, said low frequency sound propagation chamber including an air conduit projecting thereinto, said air conduit having a first end opening toward said low frequency range driver and a second end opening below and exterior of said low frequency sound propagation chamber and where said air conduit extends at least half of the height of said low frequency sound propagation chamber such that said air conduit allows air to migrate within said low frequency sound propagation chamber while limiting disruption of the air in the low frequency sound propagation chamber.

2. The speaker according to claim 1, said driver support member having only sound reflective exposed surfaces.

3. The speaker according to claim 1, said low frequency sound propagation chamber having a sound absorbing interior liner.

4. The speaker according to claim 1, said air conduit being centrally located within said low frequency sound propagation chamber, vertically oriented, and having only sound reflective exposed surfaces.

5. The speaker according to claim 4, said housing having a plurality of horizontally oriented, vertically spaced apart slats formed therein, said slats disposed to communicate between said low frequency sound propagation chamber and the exterior of said housing.

6. The speaker according to claim 1, said driver support member having a partially tubular lateral wall including openings formed in said lateral wall, and said speakers being arranged coaxially within said driver support member.

7. The speaker according to claim 6, said housing further including an upper section disposed above said low frequency sound propagation chamber, said housing thus having a lower section enclosing said low frequency sound propagation chamber, said upper section and said lower section of said housing assuming a truncated obeliskoid configuration.

8. The speaker according to claim 7, said lower section of said housing having a lowermost width in a range of sixteen to twenty inches, an uppermost width in a range of twelve to sixteen inches, and a height in a range of twenty-two to twenty-seven inches, said driver support member having a diameter in a range of eleven to thirteen inches, and said low frequency sound propagation chamber having an air conduit projecting thereinto, said air conduit having a proximal end opening towards said low frequency range driver and a distal end opening to the exterior of said housing below said housing, said air conduit extending into said low frequency sound propagation chamber more than half of the diameter of projection of said air conduit, whereby said air conduit enables air to migrate within said low frequency sound propagation chamber while limiting disruption of air occupying said low frequency sound propagation chamber, said air conduit having a height in a range of thirteen to fifteen inches.

9. The speaker according to claim 1, further including caster wheels fixed to and depending from said housing, whereby said speaker may be maneuvered by being wheeled on a floor surface.

10. A speaker propagating phase and time coherent sound waves in the manner of a point source, comprising:

a relatively high frequency range driver, a relatively low frequency range driver, and an intermediate frequency range driver;

a driver support member supporting said high frequency range driver, said intermediate frequency range driver, and said low frequency range driver thereon, said high frequency range driver and said intermediate frequency range driver disposed upon said driver support member to project sound waves in one direction, and said low frequency driver disposed upon said driver support member to project sound waves in an opposite direction, said driver support member having a partially tubular lateral wall including openings formed in said lateral wall, and said speakers, being arranged coaxially within said driver support member, said driver support member having only sound reflective exposed surfaces; and a housing having a lower section forming a low frequency sound propagation chamber disposed below said low frequency driver and enclosing said low frequency sound propagation chamber, said low frequency sound propagation chamber having a plurality of horizontally oriented, vertically spaced apart slats formed in said housing, said slots disposed to communicate between said low frequency sound propagation chamber and the exterior of said housing, a sound absorbing interior liner, an air conduit projecting thereinto, said air conduit having a proximal end opening towards said low frequency range driver and a distal end opening to the exterior of said housing below said housing, said air conduit extending into said low frequency sound propagation chamber more than half of the height of said low frequency sound propagation chamber, whereby said air conduit enables air to migrate within said low frequency sound propagation chamber while limiting disruption of air occupying said low frequency sound propagation chamber, said air conduit being centrally located within said low frequency sound propagation chamber, vertically oriented, and having only sound reflective exposed surfaces, and an upper section disposed above said low frequency sound propagation chamber, said upper section and said lower section of said housing assuming a truncated obeliskoid configuration, said lower section of said housing including caster wheels fixed to and depending from said housing, whereby said speaker may be maneuvered by being wheeled on a floor surface.

* * * * *